United States Patent [19]

Cordell

[11] 4,037,171

[45] July 19, 1977

[54] HIGH SPEED TONE DECODER UTILIZING A PHASE-LOCKED LOOP

[75] Inventor: Robert Roger Cordell, Tinton Falls, N.J.

[73] Assignee: Bell Telephone Laboratories, Incorporated, Murray Hill, N.J.

[21] Appl. No.: 658,728

[22] Filed: Feb. 17, 1976

[51] Int. Cl.² .............................................. H03B 3/04
[52] U.S. Cl. ................................. 331/14; 324/83 R; 331/12; 331/64
[58] Field of Search ................... 331/64, 12, 1, 14; 324/83

[56] References Cited

U.S. PATENT DOCUMENTS

| | | | |
|---|---|---|---|
| 2,930,892 | 3/1960 | Palmer | 331/64 |
| 3,080,533 | 3/1963 | Edwards | 331/64 |
| 3,199,037 | 8/1965 | Graves | 324/83 FE |
| 3,336,534 | 8/1967 | Gluth | 331/12 |
| 3,456,196 | 7/1969 | Schneider | 331/12 |
| 3,801,925 | 4/1974 | Parkyn | 331/64 |
| 3,922,602 | 11/1975 | Lunquist | 331/64 |
| 3,952,261 | 4/1976 | Hara et al. | 331/12 |

*Primary Examiner*—John Kominski
*Attorney, Agent, or Firm*—Richard B. Havill

[57] ABSTRACT

A narrow-band tone decoder has a controllable oscillator, connected in a fast-capture phase-locked loop, for generating a signal having a frequency determined by a control signal produced within the loop. A synchronous detector, which responds to an input signal of the tone decoder and to a signal from the controllable oscillator, produces a signal having a magnitude dependent upon the magnitudes of the input signal and of the signal from the controllable oscillator. A window comparator monitors the control signal within the loop for deciding when the generated signal is within a predetermined frequency range.

14 Claims, 7 Drawing Figures

HIGH SPEED TONE DECODER UTILIZING A PHASE-LOCKED LOOP

BACKGROUND OF THE INVENTION

The invention is a narrow-band phase-locked loop tone decoder using a fast-capture phase-locked loop.

In the prior art, a phase-locked loop tone decoder, disclosed on pages 38–47 of a book, entitled *Signetics Linear Phase Locked Loop Applications Book*, 1972, uses a second order phase-locked loop. Such a loop includes a phase detector, a low-pass filter, and a controlled oscillator within the loop. The low-pass filter determines both the capture range of the loop and the desired frequency detection range. The capture and detection ranges are coterminous. A synchronous detector is arranged to respond to the input signal of the decoder and to the output of the oscillator for producing a strong output signal when the input signal tone and the oscillator output are in phase with one another.

For such tone decoders, the time required to capture an input signal varies inversely with the pass band of the filter in the second order phase-locked loop. Although the pass bandwidth can be made very narrow by selection of components of the low-pass filter, the speed of capture varies inversely with that bandwidth. Slow operation of the detector results from long time constants created by components required in the narrow-band low-pass filter.

If a signal is to be decoded in a brief period of time within a narrow detection band, such a second order phase-locked loop may not always capture the signal for decoding before the signal is terminated.

Thus, there is a need for a narrow-band tone decoder arrangement which will determine within a brief period of time whether or not an applied signal falls within a predetermined narrow frequency range.

Therefore it is an object to provide a fast-operating narrow-band tone decoder.

It is a further object to rapidly determine whether or not a received tone signal is within a narrow frequency band.

It is another object to provide an improved phase-locked tone decoder.

SUMMARY OF THE INVENTION

These and other objects are realized by a tone detector including a controllable oscillator connected in a phase-locked loop for generating a signal having a frequency determined by a control signal produced within the loop. A synchronous detector, responsive to an input signal of the tone decoder and to a signal from the controlled oscillator, produces a signal having a magnitude dependent upon the input signal and the signal from the controllable oscillator. A circuit monitors the control signal within the loop for deciding when the generated signal is within a predetermined frequency range.

It is a feature for a circuit monitoring the control signal within a phase-locked loop to decide when the frequency of the signal generated by the controllable oscillator of the loop is within a predetermined frequency range.

It is another feature to use a phase-locked loop having a capture range substantially wider than the predetermined frequency range.

It is a further feature to use a first order phase-locked loop.

It is a still further feature to use a window comparator for monitoring the control signal within the phase-locked loop for deciding when the frequency of the signal generated by the controllable oscillator of the loop is within a predetermined frequency range.

BRIEF DESCRIPTION OF THE DRAWINGS

These and other objects and features of the invention may be more fully understood by reference to the following detailed description when that description is read with reference to the attached drawings wherein.

DETAILED DESCRIPTION

Figure 1:
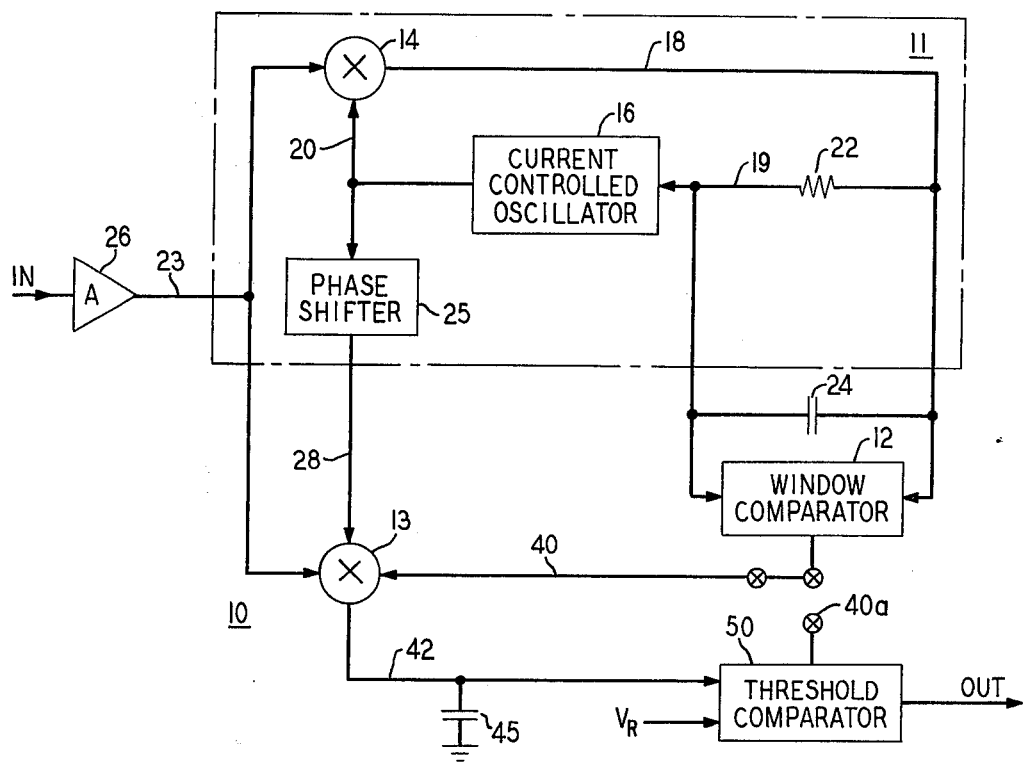
FIG. 1 is a block diagram of an illustrative embodiment of a tone decoder arranged in accordance with the invention.

Referring now to FIG. 1, there is shown a fast operating narrow-band tone decoder circuit 10 for monitoring whether or not a signal received at terminal IN has a frequency within a predetermined range and has an amplitude exceeding a threshold for a specific period of time. An output signal is produced at a terminal OUT whenever the input signal has the appropriate combination of frequency, amplitude and duration. Otherwise no output signal is produced.

The decoder circuit 10 includes a fast operating phase-locked loop 11 arranged in combination with a window comparator 12 and a synchronous detector 13.

The fast operating loop 11 is a simple first order phase-locked loop. It includes a phase detector 14 and a current controlled oscillator 16 interconnected in the loop by way of leads 18, 19, and 20 and a resistor 22.

Phase detector 14 may be any selected one of a number of well known phase detectors which produce an output current signal. In a preferred embodiment of the invention, the selection is a double-balanced triangle comparator having a current-phase transfer characteristic with equal slopes of opposite polarity recurring every cycle. Details of such a comparator, or phase detector, are described in an article entitled "A Precise Four-Quadrant Multiplier with Subnanosecond Response" by Barrie Gilbert, *IEEE Journal of Solid-State Circuits*, December 1968, pages 365–373, and are shown in schematic form in FIGS. 8–34 of the aforementioned applications book.

The phase detector 14 receives two input signals. One input of such phase detector is a modified input signal that is applied double-rail by way of a pair of leads 23 to the tone decoder. A differential amplifier 26 is interposed in the input circuitry for modifying received input signals into low-level balanced square-wave signals which are applied to the phase detector 14. The differential amplifier 26 provides voltage level shifting and preserves zero crossings of the input signal. A second input to the phase detector 14 is applied from the oscillator 16 by way of the pair of double-rail leads 20 to the phase detector 14.

The phase-locked loop 11 locks on to any input tone having, for a brief interval, a reasonably high amplitude and a frequency falling within a wide capture range of the loop. The loop is able to rapidly capture input signals because it is a first order loop. The oscillator 16 is the only first order network element within the loop. Lead 18 conducts control current, generated by the phase detector 14, through the resistor 22 and the lead 19 to a control input of the current controlled oscillator 16.

Because the tone detector is designed for tone detecting applications, the oscillator should be a stable one having a nominal operating frequency that remains close to the center of the desired detection range. A suitable oscillator is described in detail in U.S. Pat. No. 3,904,989, entitled "Voltage Controlled Emitter-Coupled Multivibrator with Temperature Compensation" and issued in the name of R. R. Cordell.

That patent describes a current-controlled oscillator arranged to operate at a frequency determined by a bias current which is an algebraic summation of the output current of a temperature dependent current source and a converter output signal current. The latter is supplied by a differential voltage-to-current converter. In the arrangement of FIG. 1 herein, the converter output signal current is replaced by the control current conducted through the resistor 22 and the lead 19 to the controlled oscillator 16.

Any change in the control current causes a corresponding change in the operating frequency of the oscillator. As a result, the frequency of oscillation locks on to the frequency of the modified input signal which is applied by way of the pair of leads 23.

In the phase-locked loop 11, capture of the input signal frequency occurs very rapidly because only the voltage dropping resistor 22 and a parallel capacitor 24 are connected directly in the path between the phase detector 14 and the oscillator 16. There are no capacitive nor resistive paths to shunt control current away from the oscillator.

There are two outputs resulting from the controlled oscillator 16. It and a phase shifter 25, which is responsive to the output of the oscillator 16, produce output signals having the same frequency but different phases, respectively, on the pairs of leads 20 and 28. In an actual embodiment of the invention, the phase shift operation was accomplished within the associated oscillator circuit.

The first output occurs on the pair of leads 28. During phase lock the signals on the leads 28 are substantially in phase with the modified input signals on the leads 23.

The second output of the oscillator 16 occurs on the leads 20. During phase lock the signals on leads 20 are substantially 90° out of phase with the signals on leads 28. The phase difference between the signals on leads 20 and 28 may be any of a wide range of differences; however, a phase difference of approximately 90° can be achieved readily in practice.

The oscillator output signal on the pair of leads 20 together with the modified input signal on the pair of leads 23 are applied as inputs to the phase detector 14. Any difference between the frequency or phase of the modified input signal and the frequency or phase of the oscillator output signal generates the control signal current in lead 18. Polarity of the control current depends upon the relative frequencies and phases of the input and oscillator signals.

The window comparator 12 is inserted in the decoder circuit for monitoring the control signal current produced by the phase detector 14 to decide when the signal generated by the controllable oscillator 16 is within a predetermined frequency range. The comparator 12 decides about the frequency of signals from oscillator 16 by monitoring voltage drop across resistor 22, which is caused by the control signal current in the leads 18 and 19. In the prior art, on the other hand, the detection range was determined by what frequencies passed through a low-pass filter included within the loop. The tone decoder circuit arrangement 10 of FIG. 1, being a faster responding first order network, has a distinct advantage over the slower responding second order network of the prior art.

Figure 3:
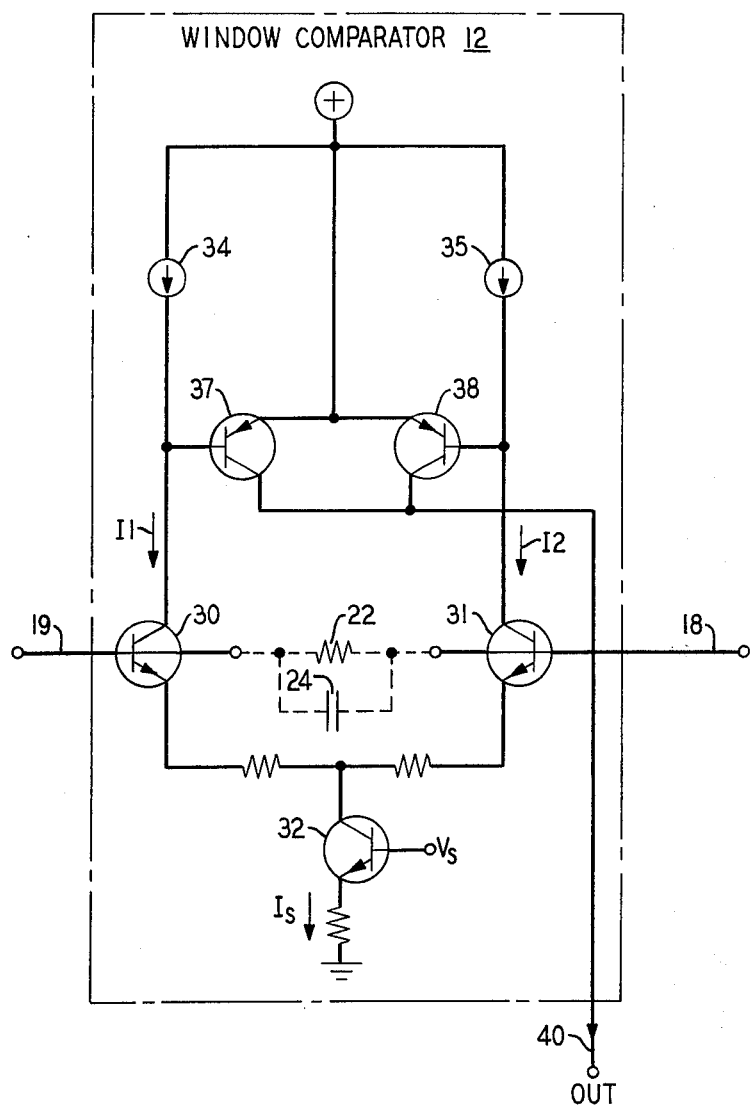
FIG. 3 is a schematic diagram of an illustrative window comparator.

Referring now to FIG. 3, there is shown an exemplary schematic diagram for the window comparator 12 which is similar to a circuit described in a copending U.S. patent application, filed on even date herewith in the name of R. R. Cordell. Input to the window comparator is through a differential voltage comparator including transistors 30 and 31. Another transistor 32 is a constant current source for the differential voltage comparator. Constant current sources 34 and 35 are connected in the collector circuits of the transistors 30 and 31, respectively. Each of the current sources 34 and 35 is arranged to supply more current than the current conducted through its associated transistor 30 or 31 when the differential amplifier is balanced. At such a time, the current sources 34 and 35 are saturated, and output switching transistors 37 and 38 are disabled. These output switching transistors are disabled at balance because of lack of base drive current.

Resistor 22 of FIG. 1, which is in series circuit between lead 18 at the output of the phase detector 14 and lead 19 at the input of the controllable oscillator 16, is shown in FIG. 3 connected directly to the base electrodes of the transistors 30 and 31 of the window comparator 12. Voltage drop created by the control current signal conducted from the phase detector 14 of FIG. 1 through the resistor 22 to the current controlled oscillator 16 controls the operation of the window comparator 12.

Figure 4:
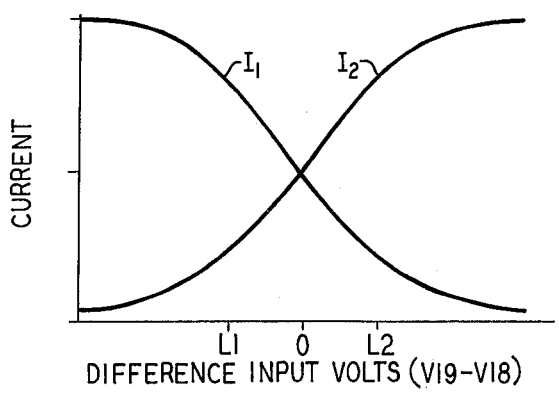
FIGS. 4 and 5 are operating characteristics of the window comparator.
Figure 5:
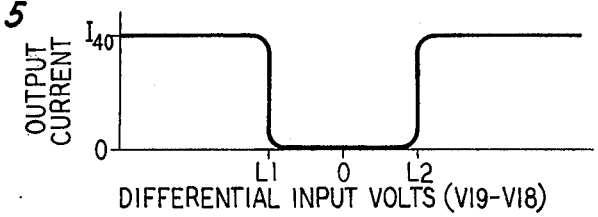

As shown in FIGS. 4 and 5, the window comparator operates in three different states in response to varying voltage drop across the resistor 22. An enabling signal, i.e., no output current, is produced by the window comparator on a lead 40 when the controlled oscillator signal is within the predetermined frequency range, as indicated by the magnitude of the voltage drop across the resistor 22. A muting signal, i.e., a high level current I40, is produced on the lead 40 when the oscillator signal is outside of the predetermined frequency range, also indicated by the magnitude of voltage drop across the resistor 22.

Figure 6:
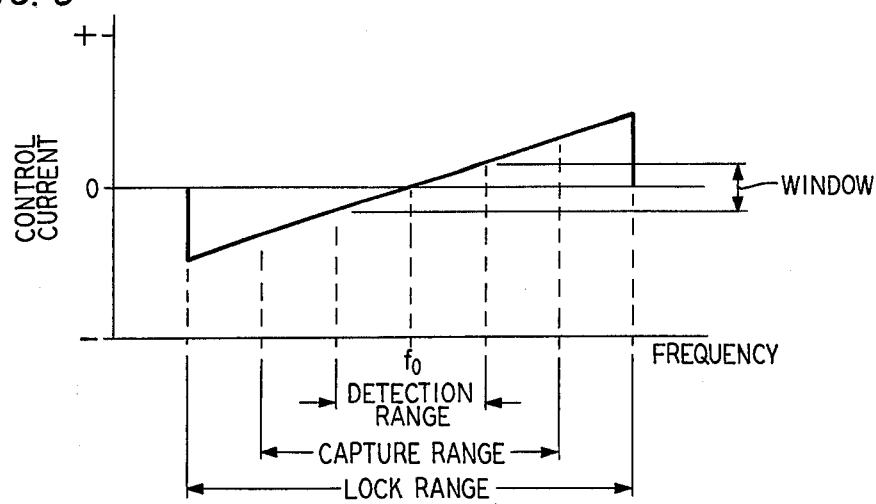
FIG. 6 is an operating characteristic for the phase-locked loops of the embodiments of FIGS. 1 and 2.

Referring now to FIG. 6, there is shown a diagram of the control current characteristic as a function of the oscillator frequency. In FIG. 6 it is noted that the detection range is substantially narrower than the capture range. The limits of the range for detection are indicated on the horizontal frequency axis. Those limits determine the magnitude of control current of both polarities and define the window. The limits of the window are converted to difference voltages in FIGS. 4 and 5.

When the input signal frequency equals the center frequency $f_o$ of the oscillator, the control current is nil and the voltage drop across resistor 22 is zero. The differential pair is balanced and comparator currents I1 and I2 are equal. Since the differential amplifier is balanced in this state, the current sources 34 and 35 are saturated, and the transistors 37 and 38 are disabled. No output current is conducted through either of the transistors 37 and 38, or on lead 40 to a control terminal of the synchronous detector 13. This lack of current in the lead 40 indicates that the output frequency of the current controlled oscillator 16 is within the predetermined frequency range.

When the input signal frequency deviates from the center frequency of the controlled oscillator 16, some control current from the phase detector 14 of FIG. 1 is conducted through the resistor 22 to the controlled oscillator. The resulting voltage drop of either polarity across the resistor 22 unbalances the differential amplifier, including transistors 30 and 31 of FIG. 3, causing unequal currents in their collector circuits. For example, if the unbalance is small enough so that the transistor 30, having a higher input voltage, fails to conduct as much current as supplied by its collector current source 34, both of the transistors 37 and 38 remain disabled. This is also true if transistor 31 has a higher input voltage but fails to conduct as much current as its current source 35. No current is conducted from the transistors 37 and 38 through the lead 40 to the control terminal of the synchronous detector 13 of FIG. 1. This condition like the previously described balanced condition indicates that the frequency of the output signal from the controlled oscillator is within the predetermined frequency detection range.

When the input signal frequency differs substantially from the center frequency of the oscillator, more control current is conducted from the phase detector 14 through the resistor 22 to the oscillator 16. The voltage drop across the resistor 22 sufficiently unbalances the differential amplifier, including transistors 30 and 31, so that one of those transistors conducts more current than is supplied by the current source in its collector circuit. Assuming that the transistor 31 is conducting more current than that supplied by source 35 at such a time, base-emitter current is conducted through the transistor 38 enabling it to conduct. Transistor 38 then supplies output current I40 through the muting lead 40 to the synchronous detector 13 of FIG. 1. That current inhibits any output signal from the synchronous detector indicating that the oscillator signal is outside of the predetermined frequency detection range.

As previously mentioned, the control current through the resistor 22 of FIG. 1 is one component of the bias current that controls the frequency of oscillation of the current controlled oscillator 16.

Bandwidth of the predetermined frequency detection range can be varied by the selection of the magnitude of the resistor 22.

The capacitor 24 is bridged across resistor 22 in FIGS. 1 and 3 for providing a high frequency short across the resistor 22 so that the window comparator responds only to the average value of the control current.

Synchronous detector 13 may be any selected one of a number of conventional detectors similar to the one selected as phase detector 14. The synchronous detector is responsive to the modified input signal on leads 23 and to the first output of the controlled oscillator 16. The first output of the oscillator 16, occurring on the leads 28, drives one input of the synchronous detector 13. The second output of the oscillator 16 on leads 20 drives one input of the phase detector. A second input of the phase detector 14 and a second input of the synchronous detector 13 are driven by the modified input signal on leads 23.

When the input signal on leads 23 has an amplitude exceeding a predetermined threshold for a predetermined duration, the synchronous detector 13 produces an output signal if the input signal is within the predetermined frequency range. Enabling and muting signals produced by the window comparator 12 are coupled through the lead 40 to the synchronous detector 13 for enabling output of that detector when the oscillator output frequency is within the desired range and for muting output of that detector when the oscillator frequency is out of that range.

Output signals from the synchronous detector 13 are coupled by way of a lead 42 to a filter capacitor 45 and to a threshold comparator 50. The capacitor 45 is connected between the lead 42 and ground for shunting high frequency signals to ground while passing low frequency signals to the threshold comparator 50. A reference voltage $V_R$ is applied to the other input of the threshold comparator 50 for determining the ratio of "turn on" delay relative to "turn off" delay.

Signals from the synchronous detector, which have sufficient amplitude for the selected interval of time, exceed the threshold voltage $V_R$ and switch the output of the threshold comparator 50 indicating that the oscillator is in lock with the input signal and that the oscillator and input signals are within the predetermined frequency range.

In FIG. 1, an input terminal 40a of the threshold comparator is shown to indicate that muting and enabling signals from the window comparator 12 can be applied to the threshold comparator rather than to the synchronous detector 13. At the choice of the designer, the lead 40 from the window comparator can be connected by way of terminal 40a to the threshold comparator for muting output signals.

Whether one chooses to apply muting and enabling signals to the synchronous detector or to the threshold comparator, the muting and enabling signals can be utilized in an opposite sense than the sense described in the foregoing description. In the opposite sense, the synchronous detector 13 or the threshold comparator 50 would be disabled when the oscillator frequency is within the desired range and enabled when the oscillator frequency is out of the range.

Figure 2:
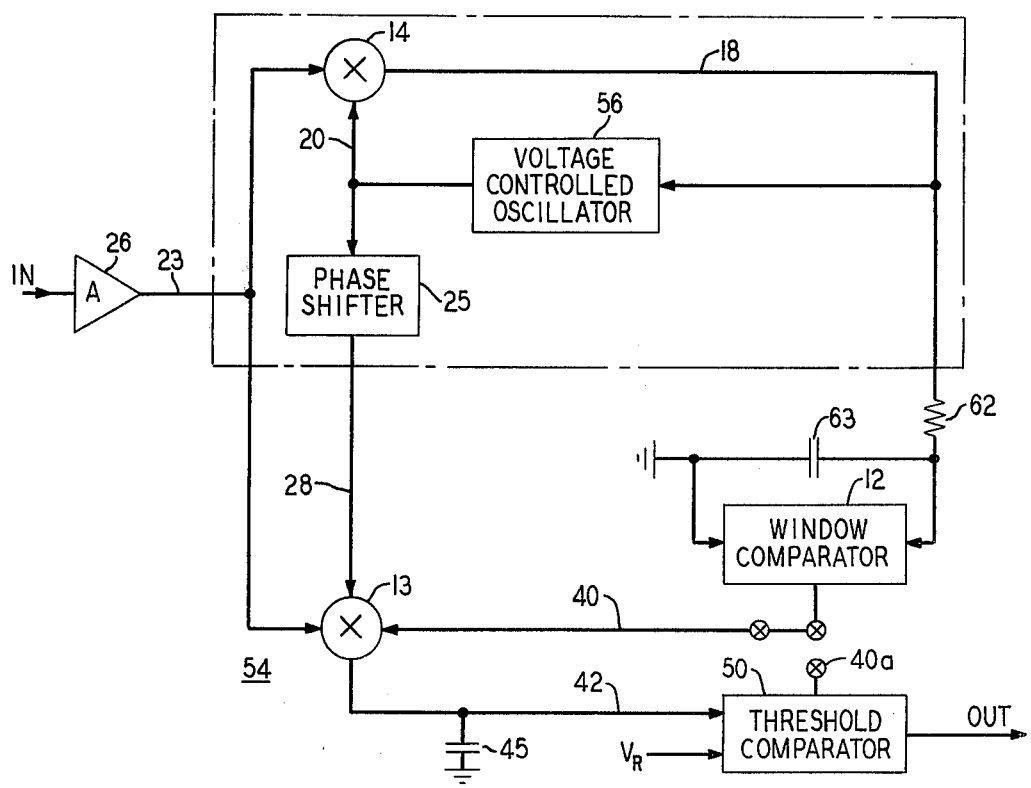
FIG. 2 is a block diagram of an alternative embodiment of a tone decoder arranged in accordance with the invention.

Referring now to FIG. 2, there is shown an illustrative arrangement of a fast operating phase-locked tone decoder 54 in which the phase-locked loop includes a voltage controlled oscillator 56 in place of the current controlled oscillator 16, shown in FIG. 1. Except for voltage controlled oscillator 56 and some filtering circuitry coupling the feedback loop to the window comparator 12, the rest of the arrangement is identical with the circuit of FIG. 1. The designators of FIG. 1 are used in FIG. 2 for designating like components.

A resistor 62 is connected between the lead 18 in series with one input of the window comparator 12. A capacitor 63 develops a voltage drop for operating the window comparator 12 similarly to the way it operates in the arrangement of FIG. 1. The resistor 62 and the capacitor 63, however, form a low-pass filter which advantageously has a much wider bandwidth than filters used in the narrow-band phase-locked loop tone decoders of the prior art. The presence of this filter does not affect the operation of the phase-locked loop because the filter is not in the loop.

The frequency range is measured by the window comparator 12 rather than being established by the low-pass filter. The wider bandwidth of the filter, including resistor 62 and capacitor 63 in FIG. 2, enables faster detection of the input signals. This fast operation enables the decoder to rapidly detect short duration tones having a frequency within the predetermined bandwidth.

Figure 7:
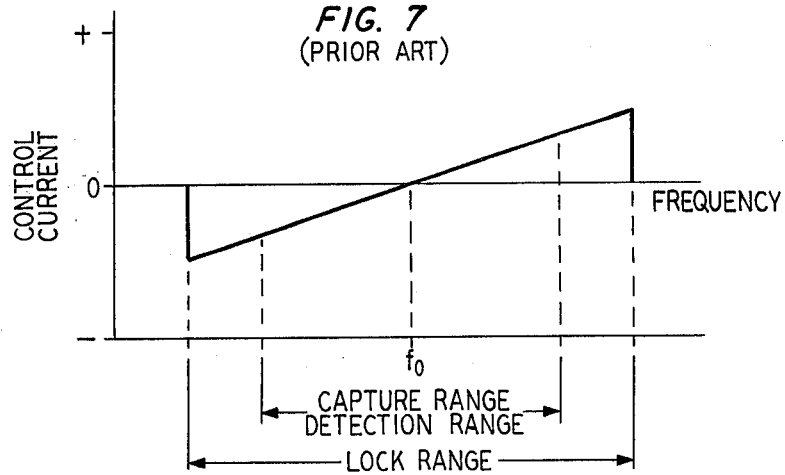
FIG. 7 is an operating characteristic for a prior art phase-locked loop.

Referring now to FIG. 7, there is shown a characteristic curve of a prior art phase lock circuit. FIG. 7 shows control current versus frequency of the oscillator as in FIG. 6. It is noted, however, that the capture range and the detection range are equal for the prior art whereas the detection range is much narrower than the capture range for the illustrative embodiments of the subject invention.

The above-detailed description is illustrative of some embodiments of the invention, and it is to be understood that additional embodiments thereof will be obvious to those skilled in the art. The embodiments described herein, together with those additional embodiments, are considered to be within the scope of the invention.

What is claimed is:

1. A tone decoder circuit comprising
   a controllable oscillator connected in a phase-locked loop for generating signals having a frequency determined by a control signal produced within the loop, the phase-locked loop having a capture range,
   a synchronous detector, responsive to an input signal of the tone decoder and to a first signal from the controlled oscillator, for producing a signal having a magnitude dependent upon the magnitudes of the input signal and the first signal from the controllable oscillator, and
   means, connected to the loop and responsive to the control signal within the loop, for monitoring when the generated signal is within a predetermined frequency range substantially narrower than the capture range of the phase-locked loop, the monitoring means applying a signal to the synchronous detector for inhibiting the output of the synchronous detector when the first signal from the controlled oscillator is outside of the predetermined frequency range.

2. A tone decoder in accordance with claim 1 wherein the phase-locked loop is a first order loop.

3. A tone decoder in accordance with claim 1 wherein the phase-locked loop is a second order loop.

4. A tone decoder circuit in accordance with claim 1 further comprising
   means for comparing the magnitude of the signal produced by the synchronous detector with a reference value and for showing when the first signal generated by the controlled oscillator is within the predetermined frequency range and that the input signal of the tone decoder has an amplitude exceeding a predetermined threshold.

5. A tone decoder circuit in accordance with claim 4 wherein
   the phase-locked loop comprises
   a current controlled oscillator,
   a phase detector responsive to the input signal of the tone decoder and to a second signal from the controlled oscillator for producing the control signal as a current within the loop, the second signal being of different phase than the first signal from the controlled oscillator, and
   means for coupling the control signal current to the current controlled oscillator, and,
   the monitoring means comprise a window comparator responsive to the control signal current for applying the indicating signal to the synchronous detector.

6. A tone decoder circuit in accordance with claim 5 wherein
   the window comparator produces the indicating signal as a uniform signal in response to the control signal current when the input signal frequency is outside of the predetermined frequency range.

7. A tone decoder circuit in accordance with claim 4 wherein
   the phase-locked loop comprises
   a voltage controlled oscillator,
   a phase detector responsive to the input signal of the tone decoder and to a second signal from the controlled oscillator for producing the control signal as a voltage, the second signal being of a different phase than the first signal from the controlled oscillator, and
   means for coupling the control signal voltage to the voltage controlled oscillator, and
   the monitoring means comprise a window comparator responsive to the control signal voltage for applying the indicating signal to the synchronous detector.

8. A tone decoder circuit comprising
   a controllable oscillator connected in a phase-locked loop for generating signals having a frequency determined by a control signal produced within the loop, the phase-locked loop having a capture range,
   a synchronous detector, responsive to an input signal of the tone decoder and to a first signal from the controlled oscillator, for producing a signal having a magnitude dependent upon the magnitudes of the input signal and the first signal from the controllable oscillator, and
   means, connected to the loop and responsive to the control signal within the loop, for monitoring when the generated signal is within a predetermined frequency range substantially narrower than the capture range of the phase-locked loop, the monitoring means applying a signal to the synchronous detector for inhibiting the output of the synchronous detector when the first signal from the controlled oscillator is within the predetermined frequency range.

9. A tone decoder circuit in accordance with claim 8 further comprising
   means for comparing the magnitude of the signal produced by the synchronous detector with a reference value and for showing when the first signal from the controlled oscillator is within the predetermined frequency range and that the input signal of the tone decoder has an amplitude exceeding a predetermined threshold.

10. A tone decoder circuit in accordance with claim 9 wherein
    the phase-locked loop comprises
    a voltage controlled oscillator,
    a phase detector responsive to the input signal of the tone decoder and to a second signal from the controlled oscillator for producing the control signal as a voltage, the second signal being out of phase with the first signal from the controlled oscillator, and means for coupling the control signal voltage to the voltage controlled oscillator, and the monitoring means comprise a window comparator responsive to the control signal voltage for applying the indicating signal to the comparing means.

11. A tone decoder circuit comprising a controllable oscillator connected in a phase-locked loop for generating signals having a frequency determined by a control signal produced within the loop, the phase-locked loop having a capture range, a synchronous detector, responsive to an input signal of the tone decoder and to a first signal from the controlled oscillator, for producing a signal having a magnitude dependent upon the magnitudes of the input signal and the first signal from the controllable oscillator, means, connected to the loop and responsive to the control signal within the loop, for monitoring when the generated signal is within a predetermined frequency range substantially narrower than the capture range of the phase-locked loop, and means for comparing the magnitude of the signal produced by the synchronous detector with a reference value and for showing when an input signal of the tone decoder has an amplitude exceeding a predetermined threshold, the monitoring means applying an indicating signal to the comparing means for inhibiting the output of the comparing means when the first signal from the controlled oscillator is outside of the predetermined frequency range.

12. A tone decoder circuit in accordance with claim 11 wherein the phase-locked loop comprises a current controlled oscillator, a phase detector responsive to the input signal of the tone decoder and to a second signal from the controlled oscillator for producing the control signal as a current within the loop, the second output signal being out of phase with the first signal from the controlled oscillator, means for coupling the control signal current to the current controlled oscillator, and the monitoring means comprise a window comparator responsive to the control signal current for applying the indicating signal to the comparing means.

13. A tone decoder circuit in accordance with claim 12 wherein the window comparator produces the indicating signal as a uniform signal in response to the control signal current when the input signal frequency is outside of the predetermined frequency range.

14. A tone decoder circuit comprising a controllable oscillator connected in a phase-locked loop for generating signals having a frequency determined by a control signal produced within the loop, the phase-locked loop having a capture range, a synchronous detector, responsive to an input signal of the tone decoder and to a first signal from the controlled oscillator, for producing a signal having a magnitude dependent upon the magnitudes of the input signal and the first signal from the controllable oscillator, means, connected to the loop and responsive to the control signal within the loop, for monitoring when the generating signal is within a predetermined frequency range substantially narrower than the capture range of the phase-locked loop, and means for comparing the magnitude of the signal produced by the synchronous detector with a reference value and for showing when an input signal of the tone decoder has an amplitude exceeding a predetermined threshold, the monitoring means applying an indicating signal to the comparing means for inhibiting the output of the comparing means when the first signal from the controlled oscillator is within the predetermined frequency range.

* * * * *